(12) United States Patent
Weatherspoon et al.

(10) Patent No.: US 8,539,666 B2
(45) Date of Patent: Sep. 24, 2013

(54) METHOD FOR MAKING AN ELECTRICAL INDUCTOR AND RELATED INDUCTOR DEVICES

(75) Inventors: Michael Raymond Weatherspoon, West Melbourne, FL (US); Louis Joseph Rendek, Jr., West Melbourne, FL (US); Lawrence Wayne Shacklette, Melbourne, FL (US); Robert Patrick Maloney, West Melbourne, FL (US); David M. Smith, Sebastian, FL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 13/293,671

(22) Filed: Nov. 10, 2011

(65) Prior Publication Data
US 2013/0120095 A1    May 16, 2013

(51) Int. Cl.
*H01F 7/06*    (2006.01)
(52) U.S. Cl.
USPC ............ 29/606; 29/602.1; 29/605; 29/607; 336/83; 336/110; 336/175; 336/178; 336/184
(58) Field of Classification Search
USPC ............ 29/602.1, 604–607, 840; 336/83, 336/110, 175, 178, 184, 214, 215, 234
See application file for complete search history.

(56) References Cited

U.S. PATENT DOCUMENTS

| | | | | |
|---|---|---|---|---|
| 3,812,442 A | 5/1974 | Muckelroy | | 336/83 |
| 5,389,428 A | 2/1995 | Fleming et al. | | 428/209 |
| 5,610,569 A | 3/1997 | Hwang et al. | | 336/200 |
| 5,805,043 A * | 9/1998 | Bahl | | 336/200 |
| 5,945,902 A | 8/1999 | Lipkes et al. | | 336/200 |
| 6,008,102 A | 12/1999 | Alford et al. | | 438/381 |
| 6,975,199 B2 | 12/2005 | Long et al. | | 336/200 |
| 7,345,563 B2 | 3/2008 | Pavier | | 336/200 |
| 7,355,264 B2 * | 4/2008 | Degani et al. | | 257/531 |
| 7,551,052 B2 | 6/2009 | Jow et al. | | 336/84 M |
| 7,607,216 B2 * | 10/2009 | Wada et al. | | 29/606 |
| 7,617,590 B2 | 11/2009 | Lee et al. | | 29/606 |
| 7,808,797 B2 | 10/2010 | Salama et al. | | 361/761 |
| 8,018,027 B2 * | 9/2011 | Bizen et al. | | 257/531 |
| 8,072,307 B2 * | 12/2011 | Kijima | | 336/200 |
| 2004/0264837 A1 | 12/2004 | Ogawa | | |
| 2005/0156698 A1 * | 7/2005 | Pleskach et al. | | 336/200 |

FOREIGN PATENT DOCUMENTS

| EP | 0694932 | 1/1996 |
|---|---|---|
| WO | 0201638 | 1/2002 |

\* cited by examiner

*Primary Examiner* — Paul D Kim
(74) *Attorney, Agent, or Firm* — Allen, Dyer, Doppelt, Milbrath & Gilchrist, P.A.

(57) ABSTRACT

A method is for making an electrical inductor. The method includes forming a first subunit having a sacrificial substrate, and an electrically conductive layer defining the electrical inductor and including a first metal on the sacrificial substrate. The method includes forming a second subunit having a dielectric layer and an electrically conductive layer thereon defining electrical inductor terminals and having the first metal, and coating a second metal onto the first metal of one of the first and second subunits. The method includes aligning the first and second subunits together, heating and pressing the aligned first and second subunits to form an intermetallic compound of the first and second metals bonding adjacent metal portions together, and removing the sacrificial substrate.

19 Claims, 8 Drawing Sheets

METHOD FOR MAKING AN ELECTRICAL INDUCTOR AND RELATED INDUCTOR DEVICES

FIELD OF THE INVENTION

The present invention relates to the field of electrical components, and, more particularly, to electrical inductors and related methods.

BACKGROUND OF THE INVENTION

An electronic device may include one or more circuit boards. A typical circuit board is a planar board that mechanically supports electronic components. The electronic components may comprise, for example, resistors, capacitors, switches, batteries, and other more complex integrated circuit components, i.e. microprocessors. The circuit board typically comprises a dielectric material, for example, a plastic material.

The circuit board may include conductive traces on the surface for connecting the electronic components to each other. As electronic circuitry has become more complex, multilayer circuit boards with at least two electrically conductive pattern layers have been developed. Typically, the different conductive trace layers of a multilayer circuit board may be connected through vertically extending vias, which comprise conductive materials, for example, metal.

A typical multilayer circuit board may comprise a plurality of core layers with bonding layers therebetween affixing the adjacent core layers together. Each core layer typically includes a dielectric layer with electrically conductive pattern layers on the opposing major surfaces of the dielectric layer. Typically, during manufacture of the multilayer circuit boards, the core and bonding layers are stacked together and then heated (laminated) to cause the bonding layer to affix the adjacent core layers together.

For example, one device application for the multilayer circuit board comprises an electrical inductor. The device is typically formed with spiral inductive elements on a major surface of the multilayer circuit board. Of course, an increase in the number of spiral inductive elements results in a commensurate rise in the generated inductance. Accordingly, there is a desire to decrease the spiral spacing between elements to generate more inductance while consuming less real estate of the multilayer circuit board.

In some applications, polymers may be used as the substrate for the spiral inductive elements. They may provide for several desirable characteristics, such as less loss. Nevertheless, the manufacturing techniques for these polymers may place a minimum on the spacing of the spiral inductive elements, for example, spiral spacing greater than or equal to 50 µm. Additionally, these polymer approaches may suffer from reduced operational bandwidth and may become self-resonant at low frequencies, i.e. making the inductor unusable.

An approach to this problem is to manufacture the spiral inductive elements on a semiconductor substrate, such as silicon or glass, where manufacturing precision is greater and allows for reduced spiral spacing. Notwithstanding the greater manufacturing resolution of building the electrical inductor on semiconductor material, these approaches may suffer from less operating bandwidth and greater loss due to the electrical characteristics of semiconductor material. Also, the semiconductor approaches may also experience self-resonance as the number of spiral inductive elements increases due to the loading effects of the semiconductor. Another drawback may include the need to insert a thick insulating layer between the semiconductor layer and the spiraled inductive elements to prevent a DC shorting of the spiral inductive elements, which adds to cost and board size.

For example, one approach is disclosed in U.S. Pat. No. 7,551,052 to Jow et al. The electrical inductor includes a high permeability magnetic substrate, conductive traces formed on the substrate to form circular inductive spirals, and a via passing through the substrate and coupling the conductive traces with additional traces on the backside of the substrate.

U.S. Pat. No. 7,345,563 to Pavier discloses a multi-layer circuit board comprising a laminate layer, a conductive layer thereon, and a magnetic layer also on the laminate layer. The multi-layer circuit board also includes a plurality of spiral inductive elements on the magnetic layer.

SUMMARY OF THE INVENTION

In view of the foregoing background, it is therefore an object of the present invention to provide a method making an electrical inductor with enhanced manufacturing resolution.

This and other objects, features, and advantages in accordance with the present invention are provided by a method of making an electrical inductor. The method includes forming a first subunit comprising a sacrificial substrate, and an electrically conductive layer defining the electrical inductor and comprising a first metal on the sacrificial substrate, and forming a second subunit comprising a dielectric layer and an electrically conductive layer thereon defining electrical inductor terminals and comprising the first metal. The method also includes coating a second metal onto the first metal of at least one of the first and second subunits, and aligning the first and second subunits together. Also, the method includes heating and pressing the aligned first and second subunits to form an intermetallic compound of the first and second metals bonding adjacent metal portions together, and removing the sacrificial substrate. Advantageously, the electrical inductor spirals may be formed with greater resolution.

More specifically, the method further comprises selecting the first metal to have a melting point temperature greater than that of the second metal, and selecting the second metal to have a melting point temperature below a lamination temperature of the dielectric layer. For example, the method may further comprise selecting the dielectric layer of the second subunit to comprise a liquid crystal polymer (LCP) layer. The method may further comprise forming the electrically conductive layer on the first subunit to define the electrical inductor having a plurality of turns.

Another aspect is directed to an electrical inductor. The electrical inductor comprises a dielectric layer, and a first electrically conductive layer on the dielectric layer comprising a first metal and defining terminals. The electrical inductor comprises a second electrically conductive layer on the dielectric layer comprising the first metal and defining inductive turns, and an intermetallic compound of the first metal and a second metal bonding adjacent metal portions together of the first and second electrically conductive layers.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Figure 1:
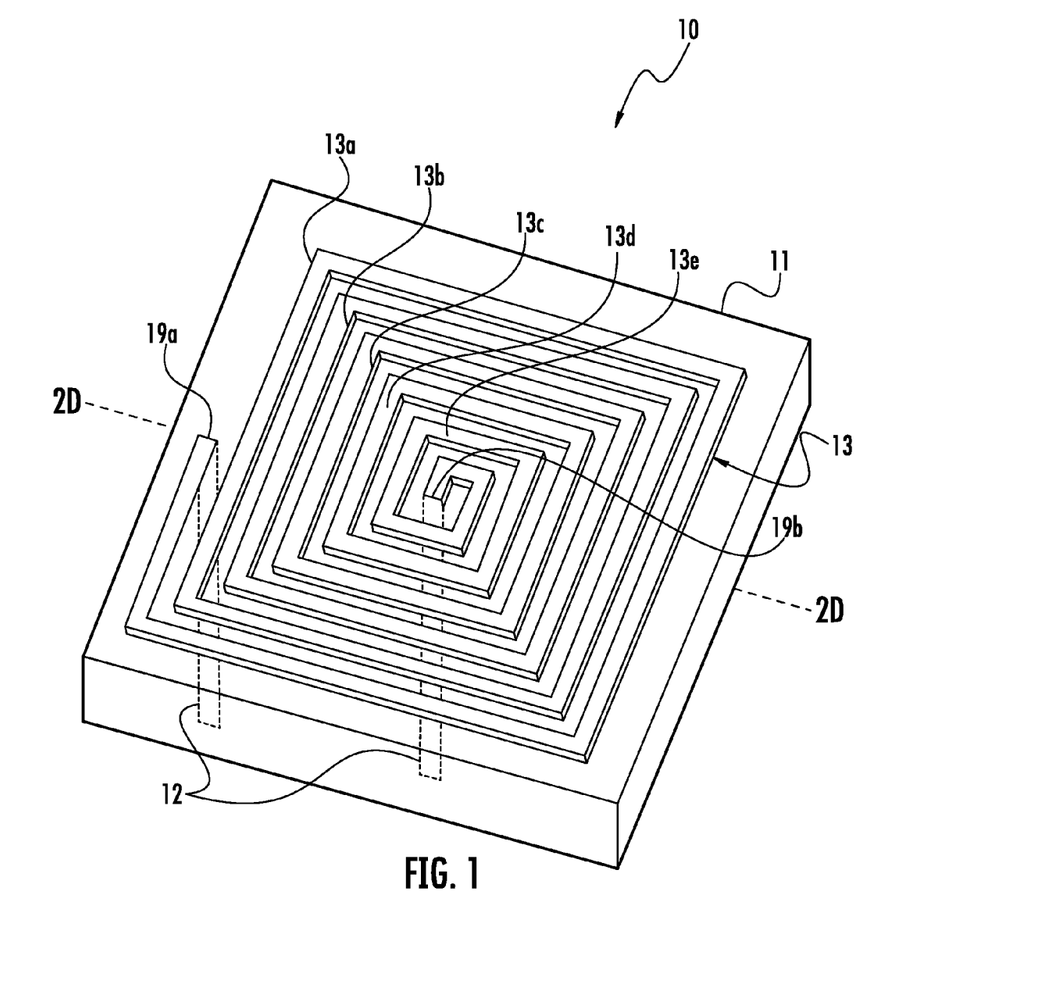
FIG. 1 is a schematic view of an electrical inductor, according to the present invention.
Figure 2A:
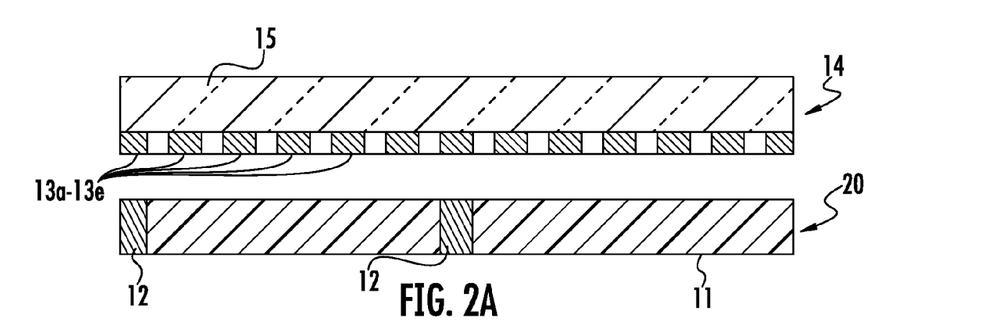
FIGS. 2A-2D are schematic cross-sectional views of the electrical inductor of FIG. 1 along line 2D during manufacturing.
Figure 2B:
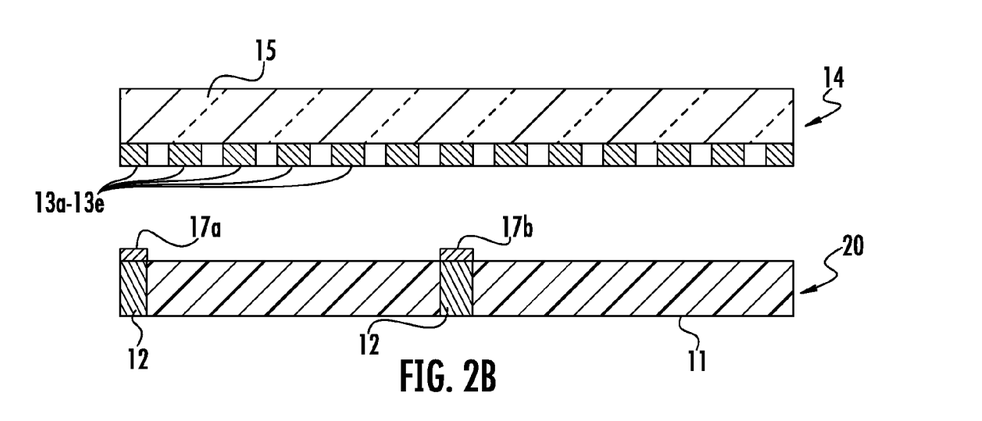
Figure 2C:
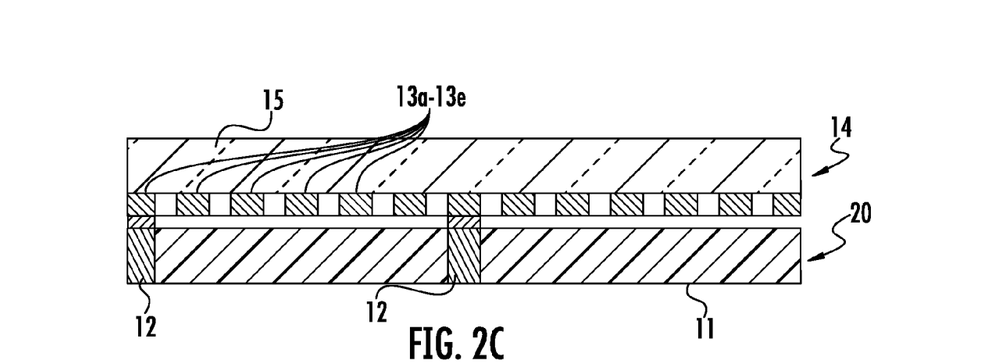
Figure 2D:
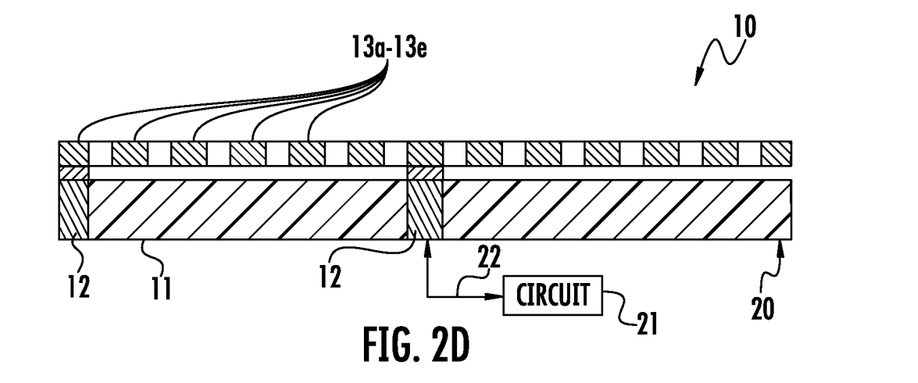

Referring initially to FIG. 1, an electrical inductor 10 according to the present invention is now described. The electrical inductor 10 includes a dielectric layer 11, and a first electrically conductive layer 12 on the dielectric layer. The first electrically conductive layer 12 comprises a first metal, such as copper, for example, and defines terminals 19a-19b for the electrical inductor 10.

The electrical inductor 10 comprises a second electrically conductive layer 13 on the dielectric layer 11 comprising the first metal and defining inductive turns for the electrical inductor. In the illustrated embodiment, the electrical inductor 10 includes rectangular spiral traces 13a-13e. Of course, in other embodiments, the spiral traces 13a-13e may have another shape, such as circular spirals, etc.

The electrical inductor 10 comprises an intermetallic compound of the first metal and a second metal bonding adjacent metal portions together of the first and second electrically conductive layers 12-13. For example, the second metal may comprise tin.

Referring now additionally to FIGS. 2A-2D and 4, a method of making the electrical inductor 10 is now described with reference to a flowchart 100, which begins at Block 101. The method includes forming a first subunit 14 comprising a sacrificial substrate 15, and an electrically conductive layer 13a-13e comprising the first metal on the sacrificial substrate. In some embodiments, the electrical conductive layer 13a-13e is formed on the sacrificial substrate 15 using typical semiconductor fabrication technology, which provides enhanced mask resolution and reduced costs. For example, the electrical conductive layer 13a-13e may be formed using physical vapor deposition (PVD), such as thermal evaporation or sputtering approaches.

Figure 4:
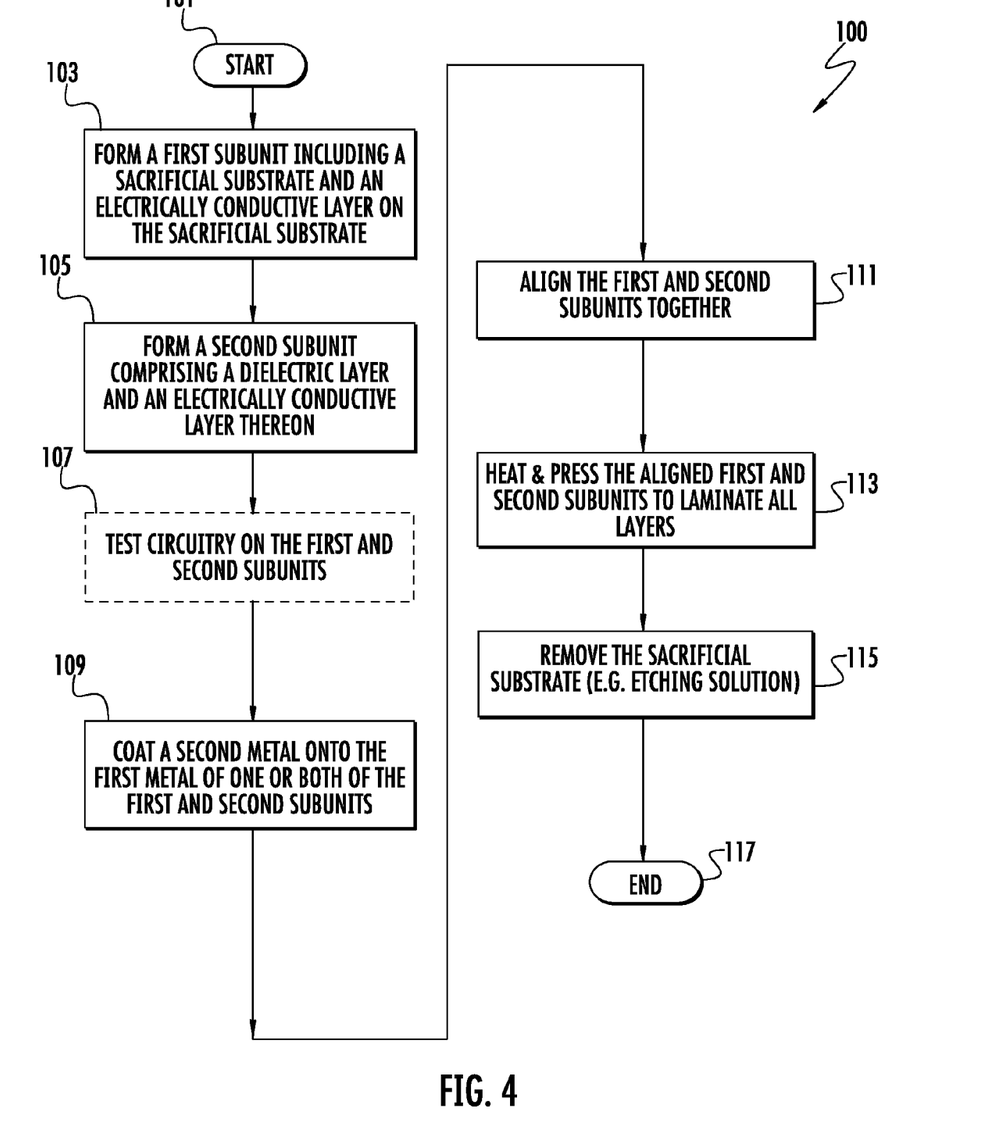
FIG. 4 is a flowchart illustrating the method of making the electrical inductor of FIG. 1.

The method includes forming the electrically conductive layer 13a-13e on the first subunit 14 to define the electrical inductor having a plurality of turns, as perhaps best seen in FIG. 1. For example, the sacrificial substrate 15 may comprise glass (Block 103).

The method also includes forming a second subunit 20 comprising a dielectric layer 11 and an electrically conductive layer 12 thereon comprising the first metal. In the illustrated embodiment, the electrically conductive layer 12 forms a plurality of vias. For example, the dielectric layer 11 may comprise an LCP dielectric layer, which has desirable electrical characteristics. As noted above, the electrically conductive layer 12 will serve as the terminals 19a-19b for the electrical inductor 10 (Block 105).

The method illustratively includes coating a second metal layer 17a-17b onto the first metal of the second subunit 20. In other embodiments, the second metal layer 17a-17b may be formed alternatively or additionally on the electrically conductive layer 13a-13e of the first subunit 14 (Block 109). The method also includes aligning the first and second subunits 14, 20 together, and heating and pressing the aligned first and second subunits to form an intermetallic compound of the first and second metals bonding adjacent metal portions together (Blocks 111 & 113).

For example, in copper-tin embodiments, the intermetallic compound comprises an intermetallic copper-tin compound. In embodiments that use LCP for the dielectric layer 11, the aligned first and second subunits 14, 20 are subject to 270° C. and 200 PSI (lamination temperature and pressure of LCP), which is above the melting point of tin, but not that of copper. For example, the aligned dielectric layer 11 of the second subunit 20 and the electrically conductive layer 13a-13e of the first subunit 14 may be laminated together in an autoclave, which advantageously provides for prevention of oxidation, dimensional stability, isostatic pressure, and prevention of layer mis-registration and squeeze out.

The method also includes removing the sacrificial substrate 15 (Blocks 115 & 117). In some embodiments, the sacrificial substrate 15 may be removed using mechanical polishing or an etching solution, plasma etching, etc. For example, the removing of the sacrificial substrate 15 may comprise using an etching solution, such as hydrofluoric acid or hydrochloric acid.

The forming of the second subunit 20 includes forming the second subunit to include a circuit 21 on the dielectric layer 11 and coupled to the electrically conductive layer 12 via a conductive trace 22. As shown with dashed lines, the method further comprises testing the circuit 21 and testing trace continuity before heating the aligned first and second subunits 14, 20 (Block 107).

Figure 3:
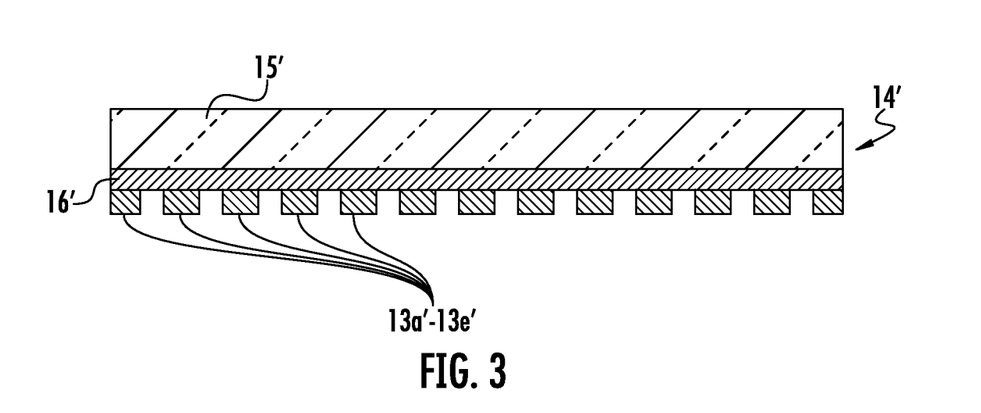
FIG. 3 is a cross-sectional view of another embodiment of the first subunit of FIG. 2A.

Referring now to FIG. 3, another embodiment of the first subunit 14 is now described. In this embodiment of the first subunit 14', those elements already discussed above with respect to FIGS. 2A-2D are given prime notation and most require no further discussion herein. This embodiment differs from the previous embodiment in that the first subunit 14' comprises a release layer 16' between the sacrificial substrate 15' and the electrically conductive layer 13a'-13e'. For example, this release layer 16' may comprise aluminum.

The first metal is selected to have a melting point temperature greater than that of the second metal, and the second metal is selected to have a melting point temperature below a lamination temperature of the dielectric layer 11.

Figure 5:
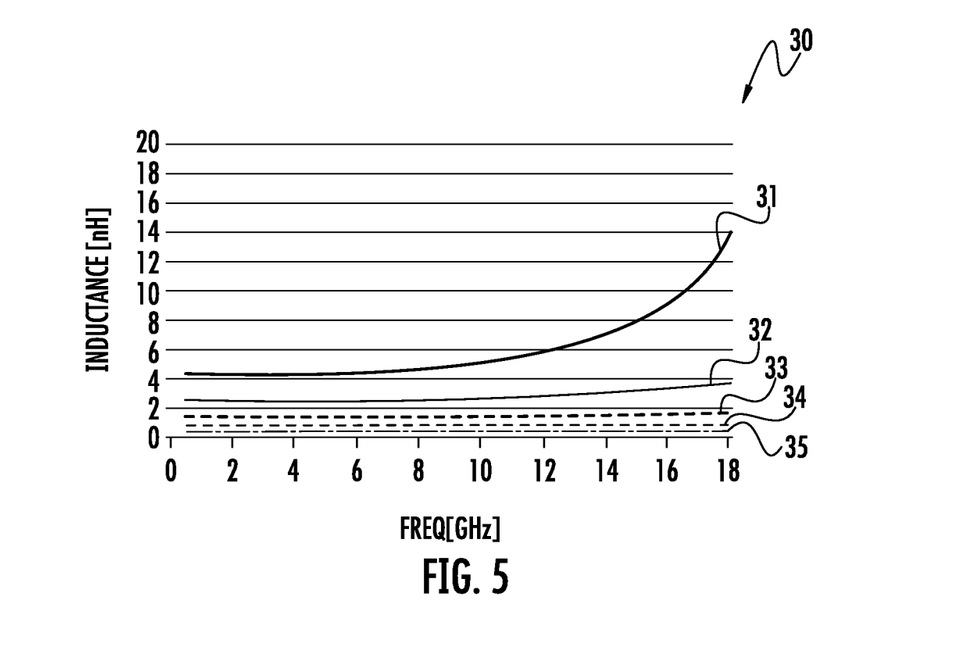
FIG. 5 is a graph illustrating inductance of the electrical inductor of FIG. 1.
Figure 6:
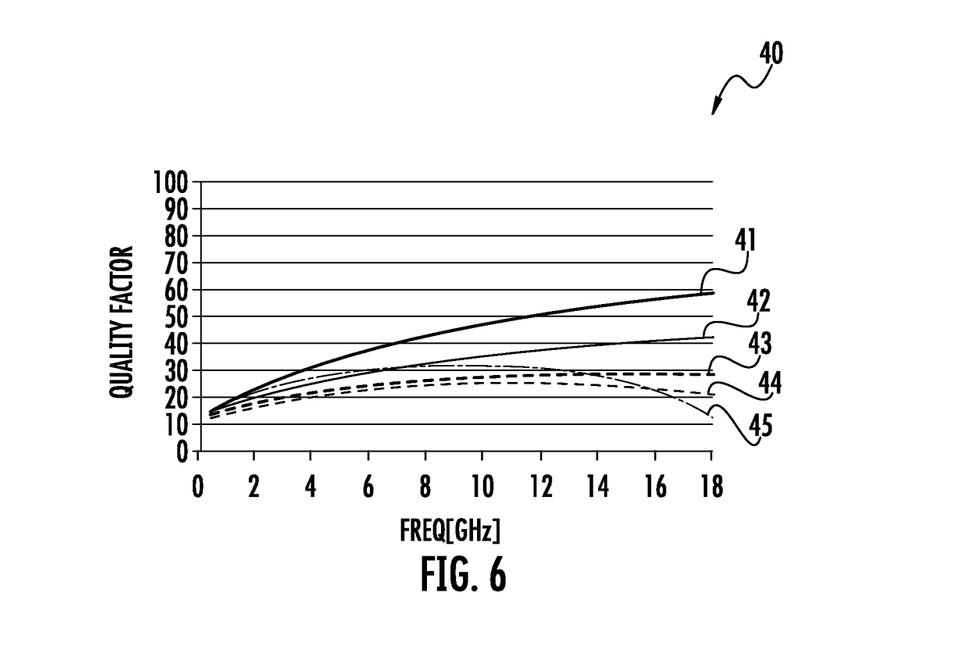
FIG. 6 is a graph illustrating a quality metric of the electrical inductor of FIG. 1.

Referring now additionally to FIGS. 5-6, graphs 30, 40 illustrate the predicted performance of the electrical inductor 10. In graph 30, the electrical inductor 10 is assumed to have a turn spacing value less than or equal to 10 μm and each trace has 10 μm of width. Curves 31, 32, 33, 34, 35 illustrate simulated inductance as the number of turns is varied, i.e. 6 turns, 5 turns, 4 turns, 3 turns, and 2 turns, respectively. As shown in the graph 30, the plotted inductance is directly proportional to the number of turns. In graph 40, curves 41,

42, 43, 44, 45 illustrate a simulated quality factor as the number of turns is varied, i.e. 6 turns, 3 turns, 4 turns, 5 turns, and 2 turns, respectively.

The quality factor is defined as $2\pi$ times the ratio of stored energy divided by the lost energy in a single cycle. Typically, higher quality factor indicates a better inductor. An ideal inductor would be a lossless inductor with infinite quality factor irrespective of the amount of current running through the windings. In a practical inductor, the windings have a series resistance associated with the conductivity of the windings themselves. This series resistance dissipates power in the form of heat while current passes. This series resistance lowers the quality factor and may be undesirable.

Figure 7A:
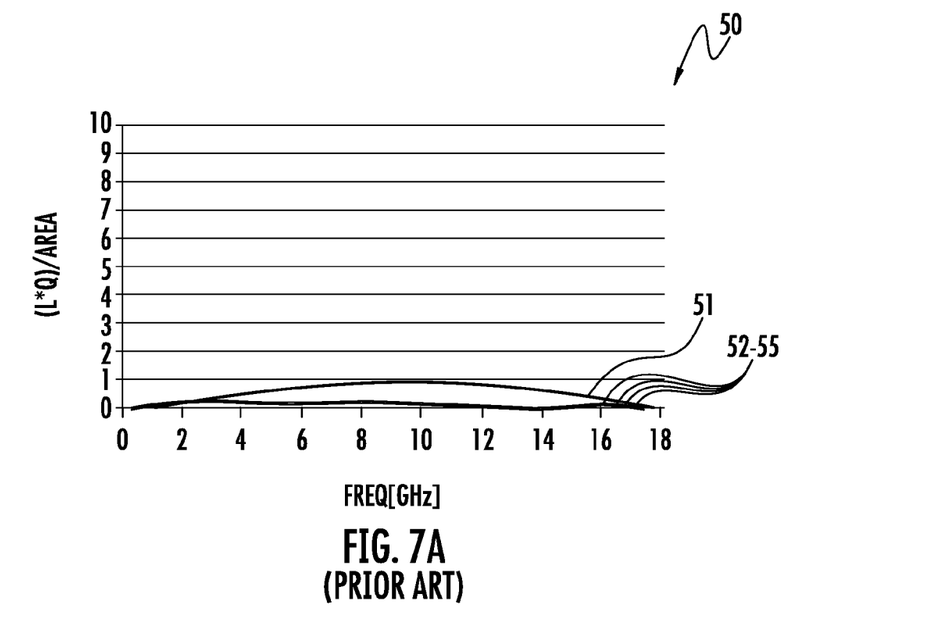
FIGS. 7A and 7B are graphs illustrating an inductance metric of electrical inductors, according to the prior art.
Figure 7B:
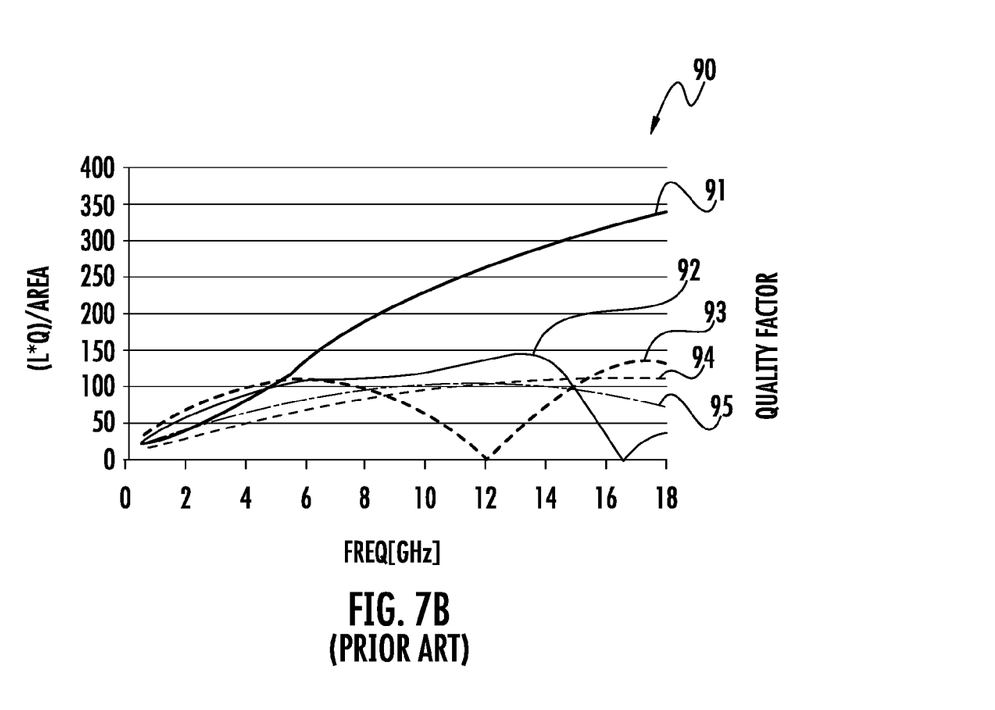

Referring now to FIGS. 7A-7B, graphs 50, 90 illustrate performance of prior art electrical inductors, i.e. graph 50 relates to a prior art electrical inductor having 50 μm wide traces with turn spacing of 50 μm (copper on LCP using typical manufacturing techniques), and graph 90 relates to a prior art electrical inductor having 10 μm wide traces with turn spacing of 10 μm (copper on silicon using typical manufacturing techniques). In graph 50, curves 51, 52, 53, 54, 55 illustrate a simulated inductance metric (L*Q/Area) as the number of turns is varied, i.e. 2 turns, 6 turns, 5 turns, 4 turns, and 3 turns, respectively. The simulated inductance metric combines: measured inductance (L), quality factor (Q), and an area used to form the electrical inductor (Area). In graph 90, curves 91, 92, 93, 94, 95 illustrate the simulated inductance metric (L*Q/Area) as the number of turns is varied, i.e. 2 turns, 5 turns, 6 turns, 3 turns, and 4 turns, respectively.

Figure 8:
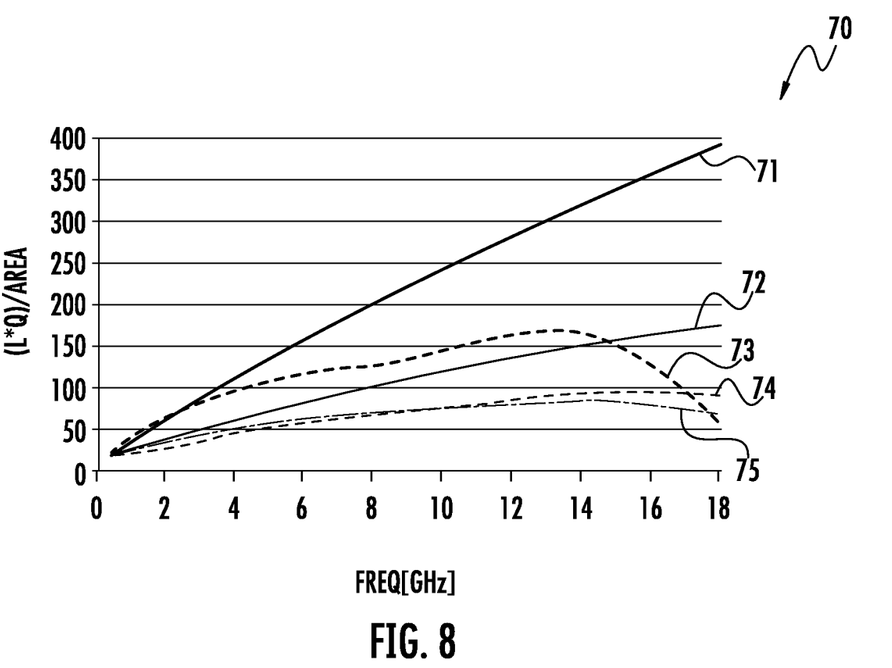
FIG. 8 is a graph illustrating an inductance metric of the electrical inductor of FIG. 1.

Referring now additionally to FIG. 8, a graph 70 illustrates performance of the electrical inductor 10 according to an exemplary embodiment of the present invention, i.e. the electrical inductor having 10 μm wide traces with turn spacing of 10 μm (copper on LCP using the manufacturing method disclosed herein). In graph 70, curves 71, 72, 73, 74, 75 illustrate the simulated inductance metric (L*Q/Area) as the number of turns is varied, i.e. 2 turns, 3 turns, 6 turns, 4 turns, and 5 turns, respectively. The simulated inductance metric demonstrates that the electrical inductor 10 of the present invention may outperform inductors fabricated with standard printed wiring board (PWB) processes. As shown in graph 70, the 2-turn embodiment (curve 71) provides the greatest inductance metric.

Figure 9:
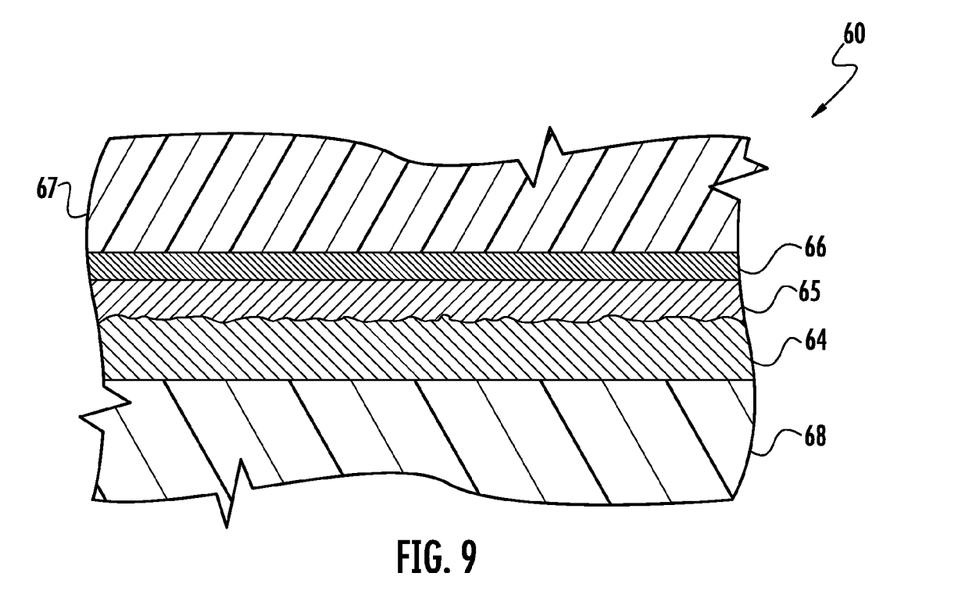
FIG. 9 is an enlarged schematic cross-sectional view of a portion of the electrical inductor, according to the present invention, during manufacturing.

Referring now additionally to FIG. 9, for embodiments including tin as the second metal and copper as the first metal, the intermetallic joint compound 60 comprises $Cu_3Sn$. Advantageously, this compound is stable and has a melting point greater than 600° C. The intermetallic joint compound 60 illustratively includes an LCP layer 68, a copper conductive trace 64, a $Cu_3Sn$ layer 65, a copper layer 66 from the opposing copper conductive trace, and a sacrificial layer 67 (which although is depicted, will not exist in the finished product since the sacrificial layer will be removed).

Advantageously, the above disclosed method for making the electrical inductor 10 provides passive components on an organic substrate, such as LCP. This method enables the construction of a hybrid device with fine feature sizes combined with the advantages of thick copper on a low loss dielectric material up to 110 GHz. This method may accommodate both RF and digital circuitry on a single substrate.

The electrical inductor 10 has a size reduction 80% of the equivalent area (having turn spacing and trace width at 10 μm) as compared to similar inductors fabricated with typical printed wiring board techniques. Also, the electrical inductor 10 has a greater self-resonant frequency than the typical electrical inductor, which results in a greater operational bandwidth, for example, 18 GHz. Moreover, since the electrical inductor 10 can be formed on a polymer substrate, such as LCP, the electrical inductor is only lightly loaded since the substrate has a lower dielectric constant.

Moreover, the electrical inductor 10 may be used in several applications, where its performance characteristics would be helpful. For example, the electrical inductor 10 can be used in extremely small, wideband RF filters and chokes for isolation and harmonic suppression. Moreover, the electrical inductor 10 may be substituted in gyrator circuits that simulate inductors in switched power supplies and other small devices. Advantageously, the gyrator circuit may be eliminated in these applications, which will reduce device complexity and save power.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method of making an electrical inductor comprising:
forming a first subunit comprising a sacrificial substrate, and an electrically conductive layer defining the electrical inductor and comprising a first metal on the sacrificial substrate;
forming a second subunit comprising a dielectric layer and an electrically conductive layer on the dielectric layer, the electrically conductive layer defining electrical inductor terminals and comprising the first metal;
coating a second metal onto the first metal of at least one of the first and second subunits;
selecting the first metal to have a melting point temperature greater than that of the second metal, and selecting the second metal to have a melting point temperature below a lamination temperature of the dielectric layer;
aligning the first and second subunits together;
heating and pressing the aligned first and second subunits to form an intermetallic compound of the first and second metals by bonding adjacent metal portions of the first and second metals together; and
removing the sacrificial substrate.

2. The method of claim 1 further comprising selecting the dielectric layer of the second subunit to comprise a liquid crystal polymer (LCP) layer.

3. The method of claim 1 further comprising forming the electrically conductive layer on the first subunit to define the electrical inductor having a plurality of turns.

4. The method of claim 1 further comprising selecting the first metal to comprise copper, and selecting the second metal to comprise tin.

5. The method of claim 1 further comprising selecting the sacrificial substrate to comprise a glass substrate.

6. The method of claim 1 wherein removing the sacrificial substrate comprises using an etching solution.

7. The method of claim 1 wherein removing the sacrificial substrate comprises using a polishing process.

8. The method of claim 1 wherein removing the sacrificial substrate comprises plasma etching the sacrificial substrate.

9. The method of claim 1 wherein forming the first subunit comprises forming the first subunit to include a release layer between the sacrificial substrate and the electrically conductive layer.

10. The method of claim 1 wherein forming the second subunit comprises forming the second subunit to include a circuit on the dielectric layer and coupled to the electrically conductive layer.

11. A method of making an electrical inductor comprising:
forming a first subunit comprising a sacrificial substrate, and an electrically conductive layer defining the electrical inductor and comprising a first metal on the sacrificial substrate;
forming a second subunit comprising a liquid crystal polymer (LCP) dielectric layer and an electrically conductive layer on the LCP dielectric layer, the electrically conductive layer defining electrical inductor terminals and comprising the first metal;
selecting the first metal to have a melting point temperature greater than that of a second metal, and selecting the second metal to have a melting point temperature below a lamination temperature of the LCP dielectric layer;
coating the second metal onto the first metal of at least one of the first and second subunits;
aligning the first and second subunits together;
heating and pressing the aligned first and second subunits to form an intermetallic compound of the first and second metals by bonding adjacent metal portions of the first and second metals together; and
removing the sacrificial substrate.

12. The method of claim 11 further comprising forming the electrically conductive layer on the first subunit to define the electrical inductor having a plurality of turns.

13. The method of claim 11 further comprising selecting the sacrificial substrate to comprise a glass substrate.

14. The method of claim 11 wherein removing the sacrificial substrate comprises using an etching solution.

15. The method of claim 11 wherein removing the sacrificial substrate comprises using a polishing process.

16. The method of claim 11 wherein removing the sacrificial substrate comprises plasma etching the sacrificial substrate.

17. A method of making an electrical inductor comprising:
forming a first subunit comprising a sacrificial substrate, and an electrically conductive layer defining the electrical inductor and comprising a first metal on the sacrificial substrate;
forming a second subunit comprising a liquid crystal polymer (LCP) dielectric layer and an electrically conductive layer on the LCP dielectric layer, the electrically conductive layer defining electrical inductor terminals and comprising the first metal;
coating a second metal onto the first metal of at least one of the first and second subunits;
aligning the first and second subunits together;
heating and pressing the aligned first and second subunits to form an intermetallic compound of the first and second metals bonding adjacent metal portions together; and
removing the sacrificial substrate.

18. A method of making an electrical inductor comprising:
forming a first subunit comprising a sacrificial substrate, an electrically conductive layer defining the electrical inductor and comprising a first metal on the sacrificial substrate, and a release layer between the sacrificial substrate and the electrically conductive layer;
forming a second subunit comprising a dielectric layer and an electrically conductive layer on the dielectric layer, the electrically conductive layer defining electrical inductor terminals and comprising the first metal;
coating a second metal onto the first metal of at least one of the first and second subunits;
aligning the first and second subunits together;
heating and pressing the aligned first and second subunits to form an intermetallic compound of the first and second metals bonding adjacent metal portions together; and
removing the sacrificial substrate.

19. A method of making an electrical inductor comprising:
forming a first subunit comprising a sacrificial substrate, and an electrically conductive layer defining the electrical inductor and comprising a first metal on the sacrificial substrate;
forming a second subunit comprising a dielectric layer, an electrically conductive layer on the dielectric layer, and a circuit on the dielectric layer and coupled to the electrically conductive layer, the electrically conductive layer defining electrical inductor terminals and comprising the first metal;
coating a second metal onto the first metal of at least one of the first and second subunits;
aligning the first and second subunits together;
heating and pressing the aligned first and second subunits to form an intermetallic compound of the first and second metals bonding adjacent metal portions together; and
removing the sacrificial substrate.

* * * * *